United States Patent [19]

Rossetti

[11] 4,240,095
[45] Dec. 16, 1980

[54] GROOVING AND GLASSIVATING METHOD FOR SEMICONDUCTOR WAFERS

[75] Inventor: Pierre C. Rossetti, Fontenay aux Roses, France

[73] Assignee: Le Silicium Semiconducteur SSC, Paris, France

[21] Appl. No.: 962,802

[22] Filed: Nov. 21, 1978

[30] Foreign Application Priority Data

Nov. 28, 1977 [FR] France .................. 77 35732

[51] Int. Cl.³ .............................. H01L 27/12
[52] U.S. Cl. ......................... 357/49; 357/45; 357/55; 357/69
[58] Field of Search ............ 357/49, 45, 55, 69

[56] References Cited

U.S. PATENT DOCUMENTS

| 4,044,454 | 8/1977 | Magdo | 357/49 |
| 4,097,890 | 6/1978 | Morris et al. | 357/49 |

FOREIGN PATENT DOCUMENTS 2306842 7/1974 Fed. Rep. of Germany .
7137300 7/1973 France .

OTHER PUBLICATIONS

IBM-Tech. Bul.-vol. 19, No. 12, May 1977, pp. 4596-4597 Antipov.

*Primary Examiner*—Edward J. Wojciechowicz
*Attorney, Agent, or Firm*—Cushman, Darby & Cushman

[57] ABSTRACT

A method is disclosed wherein grooves between elementary chips of a semiconductive wafer are stepped and then glassivated whereby the glassivation does not raise above the surface of the wafer.

8 Claims, 5 Drawing Figures

U.S. Patent     Dec. 16, 1980     4,240,095
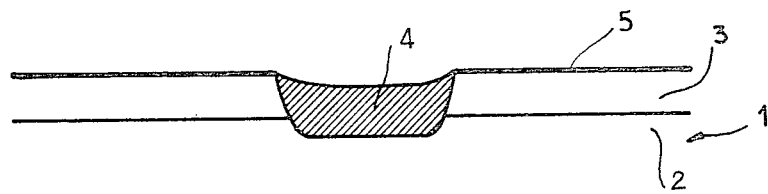
Fig:1 Prior Art
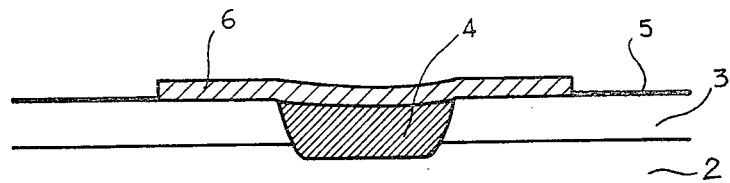
Fig:2 Prior Art
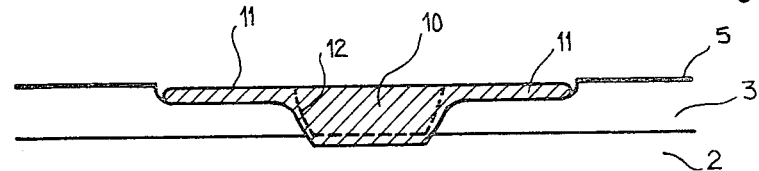
Fig:3
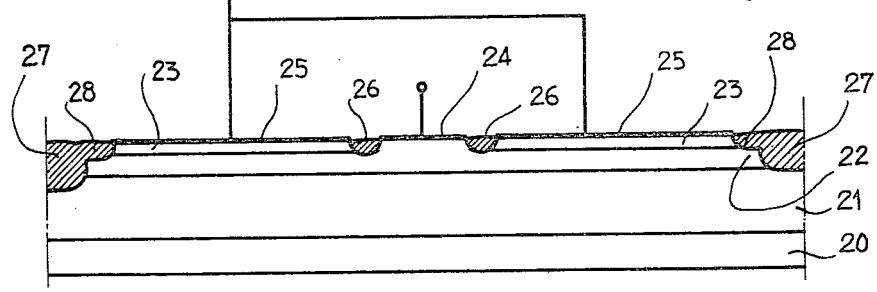
Fig:4
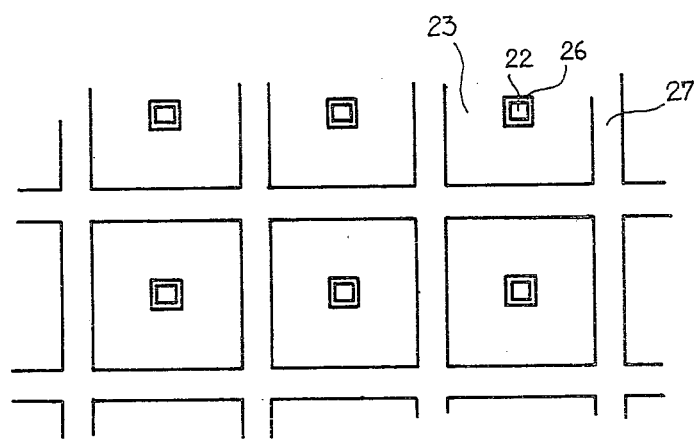
Fig:5

4,240,095

GROOVING AND GLASSIVATING METHOD FOR SEMICONDUCTOR WAFERS

FIELD OF THE INVENTION

The invention relates to a grooving and passivating method and structure for semiconductive devices.

BACKGROUND OF THE INVENTION

Generally, semiconductive devices are made from semiconductive wafers alternatively doped in the N and P type. Those wafers are then separated into chips. Grooves are formed at the limits of the elementary chips to be cut. The grooves are then filled with a passivating agent, for example glass; this operation is called glassivation. Then, the glass layer is scribed at its upper surface and the wafers are broken into the elementary chips. The glassivation is useful in particular for passivating the junctions emerging at the limits of the chips in case of mesa type structures (one usually differentiates the mesa type semiconductors wherein the layer limits emerge on the sides of the semiconductor device from the planar type semiconductors wherein the layer limits emerge at the level of a main surface of the chip).

FIG. 1 shows in a schematical and exemplary way an upper portion of a semiconductive device 1 comprising in particular a junction between layers 2 and 3. A groove 4 is formed and filled with a passivating glass. Thus, the glass serves to passivate the junction between the layers 2 and 3. During the last making steps of the semiconductive device, a metallization 5 is deposited onto the upper surface at the neighbourhood of the edge of the semiconductor device, close to the groove 4. Practically, it appears that the tightness between the glassivation in the groove 4 and the limit of the layer 3 is generally not sufficient and the metallization penetrates along the limit of the layer 3 and the groove 4. Such a penetration affects the performance of the semiconductive devices and can short the layers 2 and 3. Thus, the simple structure of FIG. 1 is in fact not often used in practice. For palliating the above drawbacks, one has provided in the art, above the glassivated grooves 4, an additional glassivation layer 6 as shown in FIG. 2. This glassivation layer 6 covers the groove 4 and is broader than the limits of the groove. For example, the layer 3 can have a depth in th range of 70 microns; the groove 4 a depth in the range of 100 microns and a width in the range of 300 microns; the layer 6 will have then an extension of about 200 microns away from the groove 4. Thus, even if the metallization 5 penetrates partially under the limit between the glassivation layer 6 and the above layer 3, it will not affect the performances of the device.

However, this prior art method presents in particular the following drawbacks. Firstly, the deposition of an additional localized glass layer is difficult to implement in practice when this deposition is not made inside the groove. Indeed, on the one hand it is difficult to achieve a mask for a glassivation, and, on the other hand, when one wants to deposit firstly a continuous glass layer which has then to be partially etched away, the operation is also difficult.

Another drawback of the device of FIG. 2 is that the layer 6 has in practice a thickness in the range of 10 microns while a metallization such as the metallization 5 has a thickness in the range of 1 micron. Thus, when one wishes in a further step to establish a contact between the layer 5 and an electrode, for example a pressure contact, this contact is not satisfactory because the electrode lies onto the raised glass portion 6 and not onto the metallic layer 5. In the same way, if one wishes to achieve a welded mounting, some methods cannot be used.

SUMMARY OF THE INVENTION

Thus, an object of the invention is to provide a new grooving and passivating structure and method for semiconductive devices palliating the above drawbacks.

According to the invention, it is provided a stepped groove, that is a deeper groove inside a wider groove, whereby the glass deposition may be made into only one step and there is no raised portion of the glassivation.

According to the inventive method, a first groove is etched after masking, then a wider groove is etched after masking and extends on a greater width than the first one. Those grooves can also be made by mechanical means such as diamond saws.

BRIEF DESCRIPTION OF THE DRAWINGS

Those objects, features and advantages and others of the invention will be explained in detail in the following description of preferred ebodiments made in connection with the attached drawings wherein:

FIGS. 1 and 2 are cross-sectional views of prior art structures;

FIG. 3 generally shows a cross-section of a structure according to the invention;

FIG. 4 shows a cross-section of a preferred embodiment of a structure according to the invention applied to a central gate thyristor; and FIG. 5 is an upper view of a mask corresponding to the structure of FIG. 4.

DETAILED DESCRIPTION OF PREFERRED EMBODIMENTS

FIG. 3 shows a cross-section of a stepped groove according to the invention. The central part 10 is substantially similar to groove 4 shown in FIGS. 1 and 2. It is additionally provided side groove portions 11 of a smaller depth. Thus, a metallization 5 may be allowed to penetrate under the lateral portion 11 but has very small chance, in practice, to penetrate under the first groove for perturbating the junction area between the layers 2 and 3, inasmuch as the width of the second groove, that is the lateral portions 11, is sufficiently large.

The formation of a groove according to the invention, such as shown in FIG. 3, is carried out by forming first a conventional groove, but having a smaller depth than the final depth to be obtained for example according to the dotted lines 12 of FIG. 3. Then, a mask is formed and an etching step is carried out for producing the wider but less deep portions 11 of the groove and deepening the central portion 10 of this groove for providing the final shape shown in FIG. 3.

FIG. 4 illustrates a specific application of the invention to the manufacturing of a mesa type thyristor. This thyristor conventionally comprises alternate type layers 20, 21, 22 and 23. At the central part of the layer 22 which is not covered with the layer 23, one connects a central contacting layer 24, and, to the opposite type layer 23, corresponding to a cathode or emitter layer, a contact layer 25 is connected. It will be recalled that, currently, in practice, through the layer 23 are provided emitter shorts, that is emergences of the layer 22 towards the surface of the device, those emergences also contacting the metallization 25. In order to allow an increase of the gate-cathode voltage, a groove 26 is often surrounding the gate area. Additionally, at the limit between two adjacent thyristors formed on the same wafer, grooves 27 are provided and shown as having a structure according to the invention, that is stepped grooves having lateral portions 28 of smaller depth than the maximum depth of the groove.

It will be noted that, in this particular application of the invention, the formation of the porton 28 wider but less deep does not cause an additional step with respect to the steps which are normally provided for manufacturing the device of FIG. 4. Indeed, this lateral portion 28 of the grooves 27 are formed during the same step as the step of formation of the insulating groove 26. For example, it will be noted that the layer 22 can have a depth in the range of 40 to 80 microns, the layer 23 from 10 to 20 microns, the deep part of the groove 27 from 50 to 100 microns and the shallow portion 28 of this groove from 10 to 30 microns. The width between the ends of the lateral portions 28 is typically twice the width of the deep part of grooves 27.

FIG. 5 is an upper view of a portion of the mask used for forming simultaneously the portions 28 of the groove 27 and the groove 26. It is apparent that this Figure is not at the same scale as FIG. 4. The mask shown in FIG. 5 is used after formation of the layers 20, 21, 22, 23 and the deep grooves 27. The metallizations are preferentially made during a further step. It will be also noted that in view of the emitter-shorts crossing the layer 23, it is not of importance that metal penetrates at the border between the groove 28 and the layer 23, such a penetration corresponding also to an emitter-short and having no nocive effects on the operation of the device. It will be also noted the junction voltage between the layers 22 and 23 is low while it can be very high between the layers 21 and 22, for example 10 V and 1000 V respectively.

The invention has been disclosed in connection with a specific embodiment and more specifically in connection with thyristors, but the scope of the invention includes various variants and modification which will clearly appear to those skilled in the art. In particular, the invention may be applied to the manufacturing of other semiconductive devices such as diodes, transistors, triacs, photothyristors, phototransistors, phototriacs, etc. In those other applications, there are also favourable cases wherein the formation of the less deep lateral portion of the grooves does not imply an additional step.

What I claim is:

1. A structure for passivating a semiconductor wafer at the limits of the elementary chips to be obtained therefrom in accordance with a selected pattern, said wafer having alternate layers of different semiconductive material, said structure having at least one first groove depending from a surface of said wafer in accordance with said pattern and at least one second groove substantially centered within said first groove in accordance with said pattern, said second groove being deeper and narrower relative to said first groove, a stepped groove for receiving a passivating agent being thereby obtained wherein said second groove intersects an interface between alternate layers and said first groove does not reach said interface.

2. A structure according to claim 1 wherein the passivating agent is a glass.

3. A structure according to claim 1, wherein the depth of said first groove is between approximately 10 and 30 microns and the depth of said second groove is between approximately 50 and 100 microns.

4. A structure according to claim 1, wherein the width of said first groove is approximately twice the width of said second groove.

5. A method for grooving and passivating a semiconductor wafer at the limit of the elementary chips to be obtained therefrom in accordance with a selected pattern, said wafer having alternate layers of different semiconductor material, comprising the steps of:

forming at least one first groove in a surface of said wafer in accordance with said pattern, said first groove having a predetermined first width and first depth, said first depth being sufficiently large whereby said first groove intersects an interface between alternate layers;

forming at least one second groove in said surface in accordance with said pattern, said second groove having a predetermined second width and second depth; said second width being greater than said first width, said first groove being substantially centered within said second groove, and said second depth being sufficiently less than said first depth whereby said second groove does not reach said interface; and applying a passivating agent to fill said first and second grooves.

6. A method as in claim 5 wherein said step of forming at least one second groove comprises the step of masking and etching for forming said second groove, whereby said first groove is deepened during the later formation of said second groove.

7. A method as in claim 6 applied to the manufacture of thyristors further comprising the step of forming insulating gate grooves, said step of forming insulating gate grooves and said step of forming at least one first groove being conducted simultaneously.

8. A stepped groove for passivating a semiconductor wafer at the limits of the elementary chips to be obtained therefrom, said wafer having alternate layers of different semiconductor material, said stepped groove comprising:

a central portion for intersecting an interface between alternate layers; and two lateral portions flanking said central portion for restricting the penetration of a metallization applied to the surface from which said stepped groove depends, said latreral portions being of sufficiently lesser depth than said central portion whereby said interface is not intersected by said lateral portions and a passivating agent being applied to said stepped groove prior to the application of said metallization.

* * * * *